United States Patent
Kahlman et al.

(10) Patent No.: US 6,545,615 B2
(45) Date of Patent: Apr. 8, 2003

(54) DEVICE FOR ENCODING A STREAM OF DATABITS OF A BINARY SOURCE SIGNAL INTO A STREAM OF DATABITS OF A BINARY CHANNEL SIGNAL, MEMORY MEANS, DEVICE FOR RECORDING INFORMATION, RECORD CARRIER, DEVICE FOR CODING AND DEVICE FOR PLAYING BACK

(75) Inventors: Josephus Arnoldus Henricus Maria Kahlman, Eindhoven (NL); Kornelis Antonie Schouhamer Immink, Geldrop (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/867,895

(22) Filed: May 30, 2001

(65) Prior Publication Data

US 2002/0009005 A1 Jan. 24, 2002

(30) Foreign Application Priority Data

Jun. 2, 2000 (EP) ............................................. 00201952

(51) Int. Cl.⁷ ................................................ H03M 7/46
(52) U.S. Cl. ......................................................... 341/59
(58) Field of Search ............................... 341/84, 85, 83, 341/59; 395/775

(56) References Cited

U.S. PATENT DOCUMENTS

| 5,151,699 A | 9/1992 | Moriyama | 341/58 |
| 5,251,321 A | * 10/1993 | Boothroyd | 341/84 |

FOREIGN PATENT DOCUMENTS

| WO | WO9933183 | 12/1998 | ............ H03M/5/14 |

* cited by examiner

*Primary Examiner*—Brian Young
(74) *Attorney, Agent, or Firm*—Michael E. Belk

(57) ABSTRACT

In a device for encoding a stream of databits of a binary source signal into a stream of databits of a binary channel signal the bitstream of the source signal is divided into n-bit source words. The device comprises converting means adapted to convert a block of p consecutive n-bit source words into a corresponding block of p consecutive m-bit channel words, such that the conversion for at least most of the n-bit source words is parity preserving and/or parity inverting, where $m > n \geq 1$. The converting means comprise memory means which contain for each n-bit source word a number of m-bit channel words, arranged in coding states, and a corresponding state number, indicating the state for a next m-bit channel word. After each block of source words q dc-control sourcebits are added, which are converted into r dc-control channelbits, independent of the conversion of a following source word.

22 Claims, 26 Drawing Sheets

DEVICE FOR ENCODING A STREAM OF DATABITS OF A BINARY SOURCE SIGNAL INTO A STREAM OF DATABITS OF A BINARY CHANNEL SIGNAL, MEMORY MEANS, DEVICE FOR RECORDING INFORMATION, RECORD CARRIER, DEVICE FOR CODING AND DEVICE FOR PLAYING BACK

The present invention relates to a device for encoding a stream of databits of a binary source signal into a stream of databits of a binary channel signal, wherein the bitstream of the source signal is divided into n-bit source words, which device comprises converting means adapted to convert a block of p consecutive n-bit source words into a corresponding block of p consecutive m-bit channel words, where p, n, m are integers and $m>n\geq 1$, the converting means comprising memory means which contain for each n-bit source word a number of m-bit channel words, arranged in coding states, and a corresponding state number, indicating the memory location for a next m-bit channel word.

Such a device is known from WO97/09718/A1 and describes a recording and reproducing system, provided with a memory, which, in response to n-bit source words and respective table numbers, generates m-bit channel words and state numbers for next source word conversions. The conversions are not parity preserving. Further said known device comprises a selection circuit, which, in response to the m-bit channel words, calculates the running DSV (digital sum value) and provides for selection signals which indicate whether the read out channel words have to increase or decrease the DSV. Although by these measures the dc-level may be incidentally reduced, an overall dc-suppression is not guaranteed, with the consequence that still distortions may be introduced in communicating systems which cannot handle a dc-component, as well as distortions in any recording of data on respective carriers.

In order to obtain a required dc-suppression, dc-control bits can be introduced on source level, however, with the consequence that the channel words do not correspond with the source words any longer. This means that, when there is an error on a data carrier, error propagation during reproducing may occur.

Further, in practice several encoding systems are known, e.g. in CD-recording and reproducing systems EFM-encoding of 8-bit source words into 17-bit channel words is applied. During recording the encoded channel words are recorded on a data carrier, while during reproducing the channel words are decoded inversely. In DVD-recording and reproducing systems EFM-plus-encoding of 8-bit source words into 16-bit channel words is applied. The channel signals therein are realized in a (2,10) sequence. However, in all these known systems a dc-suppression in the channel word sequence is not guaranteed.

Referring to the above it may be noticed that encoding devices in general provide for encoded channel words in a (d,k) sequence, wherein d is the number of 'zeros' which at least is present between two subsequent 'ones' in the serial datastream of the channel signal and k the number of 'zeros' which at most is present between two subsequent 'ones' in the serial datastream of the channel signal. The description in said international patent application shows a conversion of blocks of 8-bit source words into blocks of 15-bit channel words in a (2,14) sequence. Although, by the presence in the memory of several coding tables, the sequence of channel words obeys the d,k-constraints, a dc-suppression, as already mentioned, is not guaranteed, because the separate conversions of n-bit source words into m-bit channel words are not parity preserving.

The purpose of the invention is to obtain an encoding device as described in the opening paragraph in which a dc-suppression in the channel word sequence is guaranteed and in which, when there is an error on a data carrier, error propagation during reproducing is avoided.

Therefore, in a first embodiment according to the invention, the device as described in the opening paragraph is characterized in that the conversion for at least most of the n-bit source words is parity preserving and/or parity inverting and that after each block of source words q dc-control sourcebits are added, which dc-control sourcebits are converted into r dc-control channelbits. In a second embodiment according to the invention, the device is characterized in that the conversion for at least most of the n-bit source words is parity preserving and/or parity inverting an that after each block of source words q dc-control sourcebits are added, which dc-control sourcebits together with only a following n-bit source word is converted into a (r+m)-bit channelword, where q and r are integers. In both cases all the source words correspond with respective channel words; in other words, source words and channel words are permanently aligned with each other. By this measure error propagation will be avoided. As in the second embodiment a separate table is provided for the conversion of (n+q)-bit source words into (m+r)-bit channel words, which is more complicated than a simple table for the conversion of q-bit dc-control source bits into r dc-control channel bits, the first embodiment is preferred.

Although parity preserving codes are known per se, instead of a parity preserving conversion of source words into channel words, also a parity inverting conversion may be applied. The conversion is parity preserving when, if the number of 'ones' in a source word is even, the number of 'ones' in a corresponding channel word is even too, and, if the number of 'ones' in a source word is odd, the number of 'ones' in a corresponding channel words is odd too. The conversion is parity inverting when, if the number of 'ones' in a source word is even, the number of 'ones' in a corresponding channel word is odd, and, if the number of 'ones' in a source words is odd, the number of 'ones in a corresponding channel words is even. In both cases the insertion of a dc-control bit provides for parity conversion In both embodiments the channel output signal sequence supplied by the converting means may be fed to a precoder to determine a RLL (run length limited) output signal, which signal is supplied to a control signal generator to derive the dc-control bits. Such a feedback loop for a parity preserving code is described in e.g. U.S. Pat. No. 5,477,222, wherein between successive groups of p consecutive n-bit source words parity preserving bits are inserted in such a way that channel words obtained thereafter do not correspond with source words any longer and propagation errors may occur.

Like source word-to-channel word conversions, the dc-control source bits-to-dc-control channel bits conversion will depend on the last m-bit channel word, determining the state of the dc-control channel bits. Therefore, according to the invention the memory means further contain for each q dc-control source bits and for each state number r dc-control channel bits and a corresponding state number, indicating the memory location for a next m-bit channel word.

In a practical embodiment n=8, m=15, q=1 and r=2, while p may be chosen dependent on the desired dc-suppression. With a conversion rate 8/15 each source byte will correspond to a 15-bit channelword in one of the tables in the memory means, independently of the dc-control bits inserted.

When in a (d,k) channel word sequence in said practical embodiment d=2 and, for example a source code in the preferred embodiment ends with "1", the dc-control bits will always be "00" as the next channel word may start with "1" and at least two zero's must be present between two "1's". This means that the control bits itself have no influence with respect to parity control. Therefore, in order to realize a parity control in this case and in suchlike cases, according to the invention, the device comprises inverting means, which, depending on a last preceding channelword and on the dc-control channelbits, provides for inversion of an odd number of bits of a following source word; i.e. the inversion of 1, 3, 5, bits of a following source word. Such an inversion identifies dc-control source bit-to-dc control channel bit conversions with dc-control channel bits of the same parity, when the following channel word is chosen from another coding state belonging to a respective source word.

As the various coding states in the memory means contain multiple used channel words, errors on a data carrier may occur, such that the source words to which the channel words refer during reproducing, are not unambiguously determined. Therefore, according to the invention, the channel words in the coding states refer substantially to a same source word.

The invention further relates to memory means with a coding table for application in a device described above. According to the invention, the coding state may contain 15-bit channel words to generate a parity preserving (2,14) sequence, or a parity preserving (2,13) sequence and even a (2,12) sequence. Although, in the latter case the k-constraint is further diminished, the disadvantage that only a small number of the 1024 source-to-channel conversions is not parity preserving must be accepted.

The invention also relates to a device for recording information, which device comprises an encoding device according as described before for converting a series of channel words representing the information into a modulated signal and means for recording an information pattern corresponding to said modulated signal on a record carrier. Apart from the specific encoding device, the recording device can be the same as described in the above mentioned WO97/09718/A1, the content of which document must be considered as inserted in the present specification.

The invention further relates to a record carrier on which a modulated signal is recorded, said signal comprising a series of channel words, obtained by encoding source words as described above.

Further, the invention relates to a device for decoding channel words into source words comprising converting means with memory means containing the same coding states as the memory means in the encoding device according to the invention; however, the coding states now are read out inversely. In connection therewith the invention also relates to a device for playing back the information on said record carrier comprising a reading arrangement for reading said record carrier and a decoding device mentioned above.

These and other aspects of the invention will be apparent from and elucidated with reference to the embodiment described hereinafter and illustrated in the accompanying drawing. In the drawing:

Figure 3A:
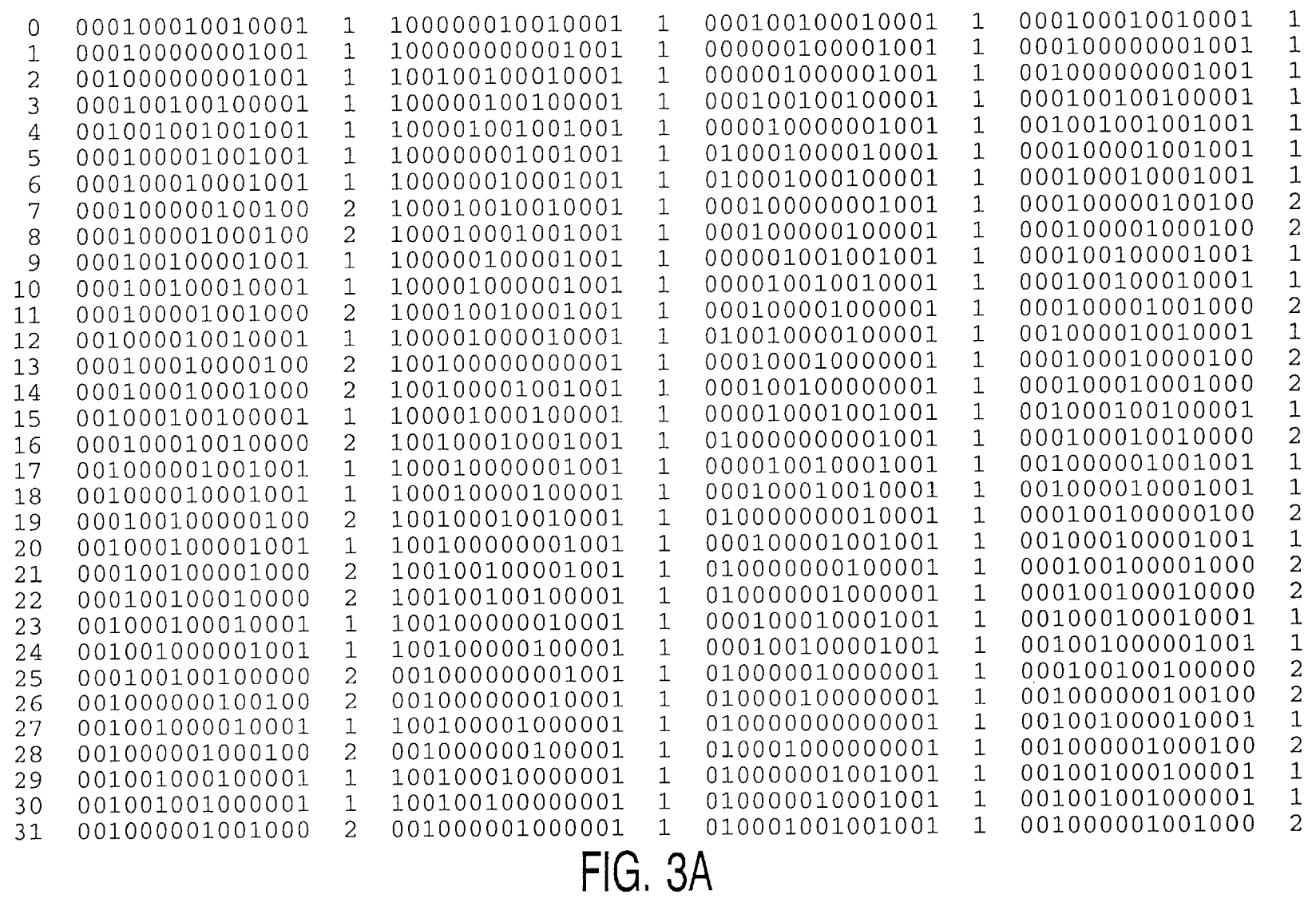
Figure 3B:
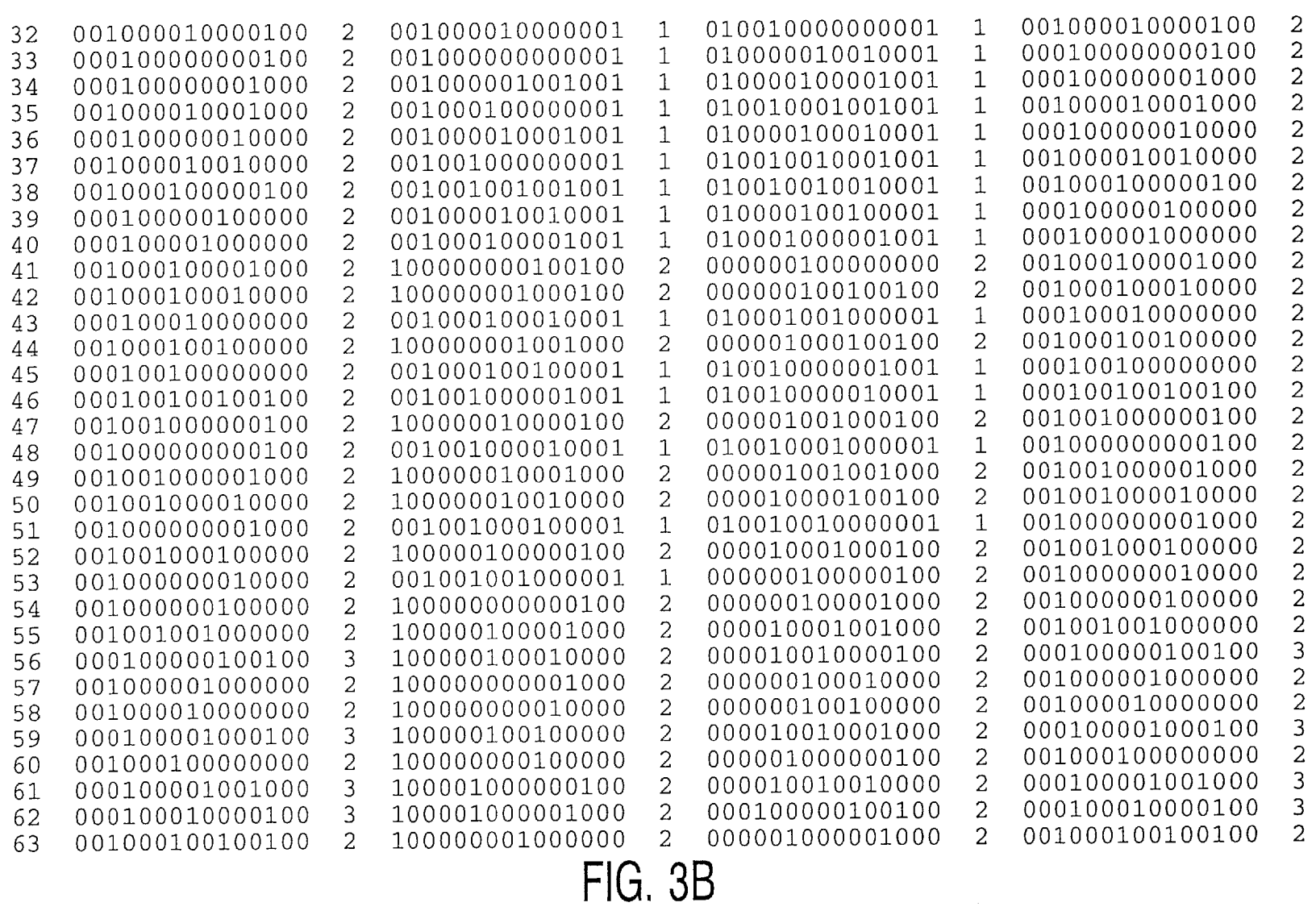
Figure 3C:
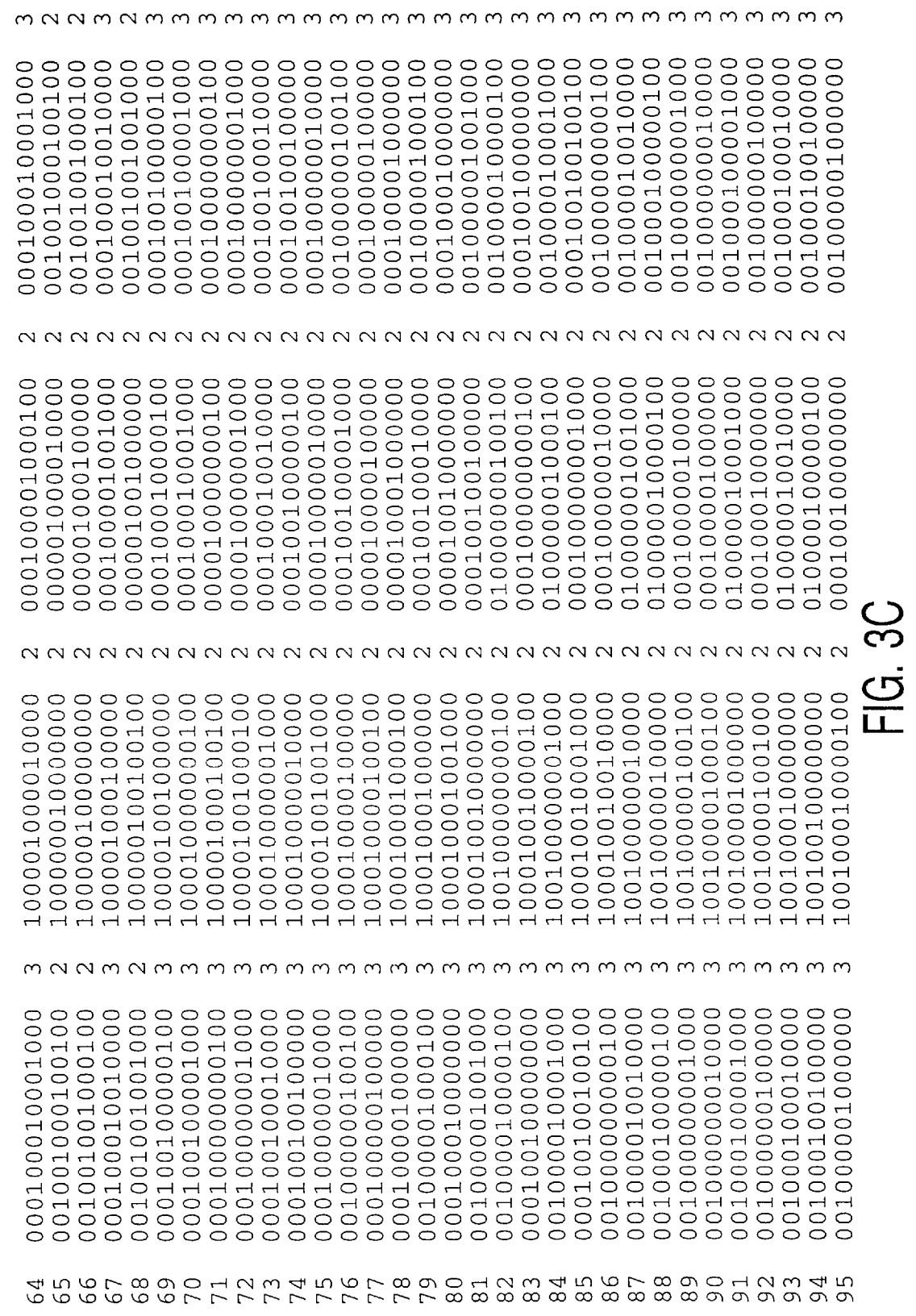
Figure 3D:
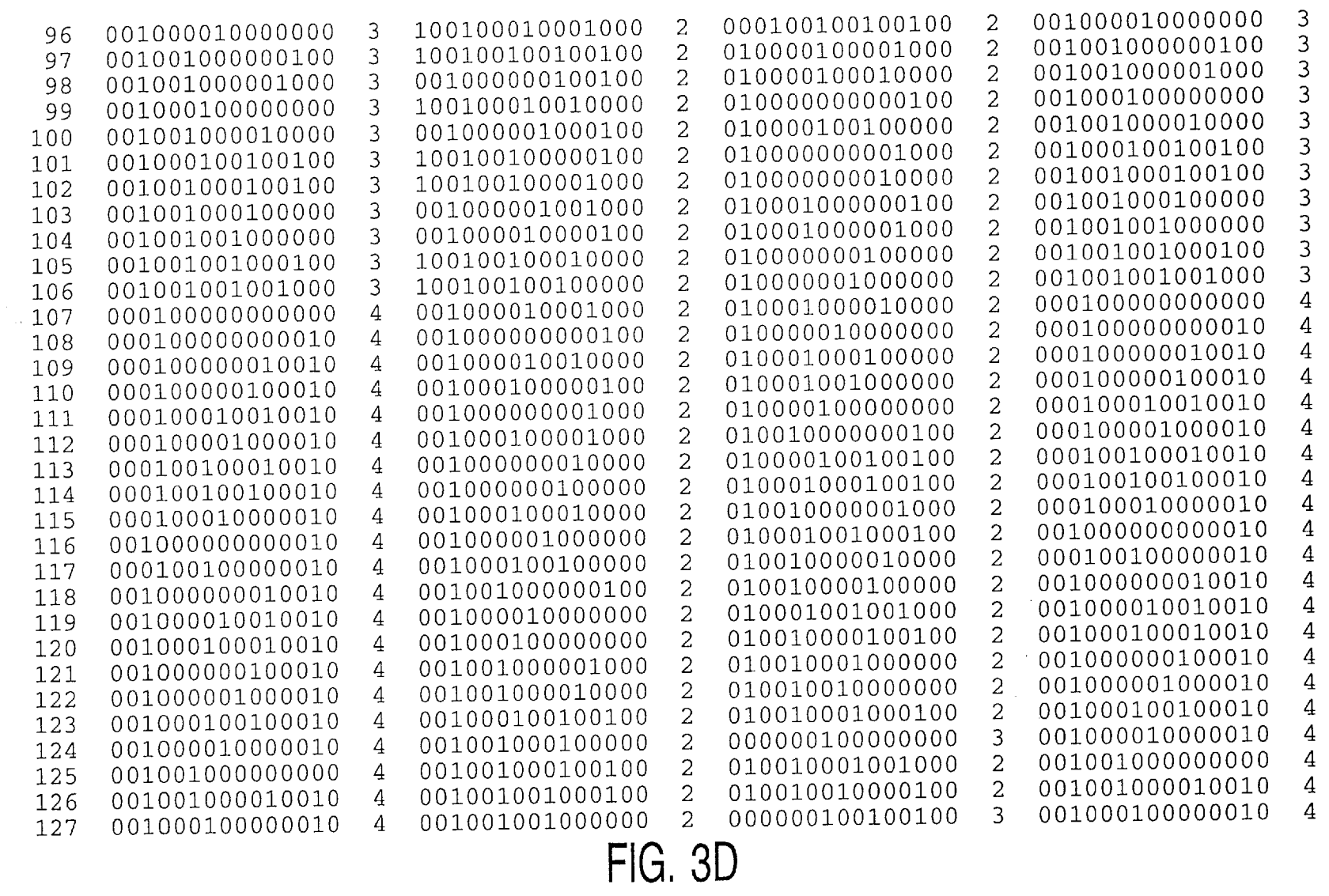
Figure 3E:
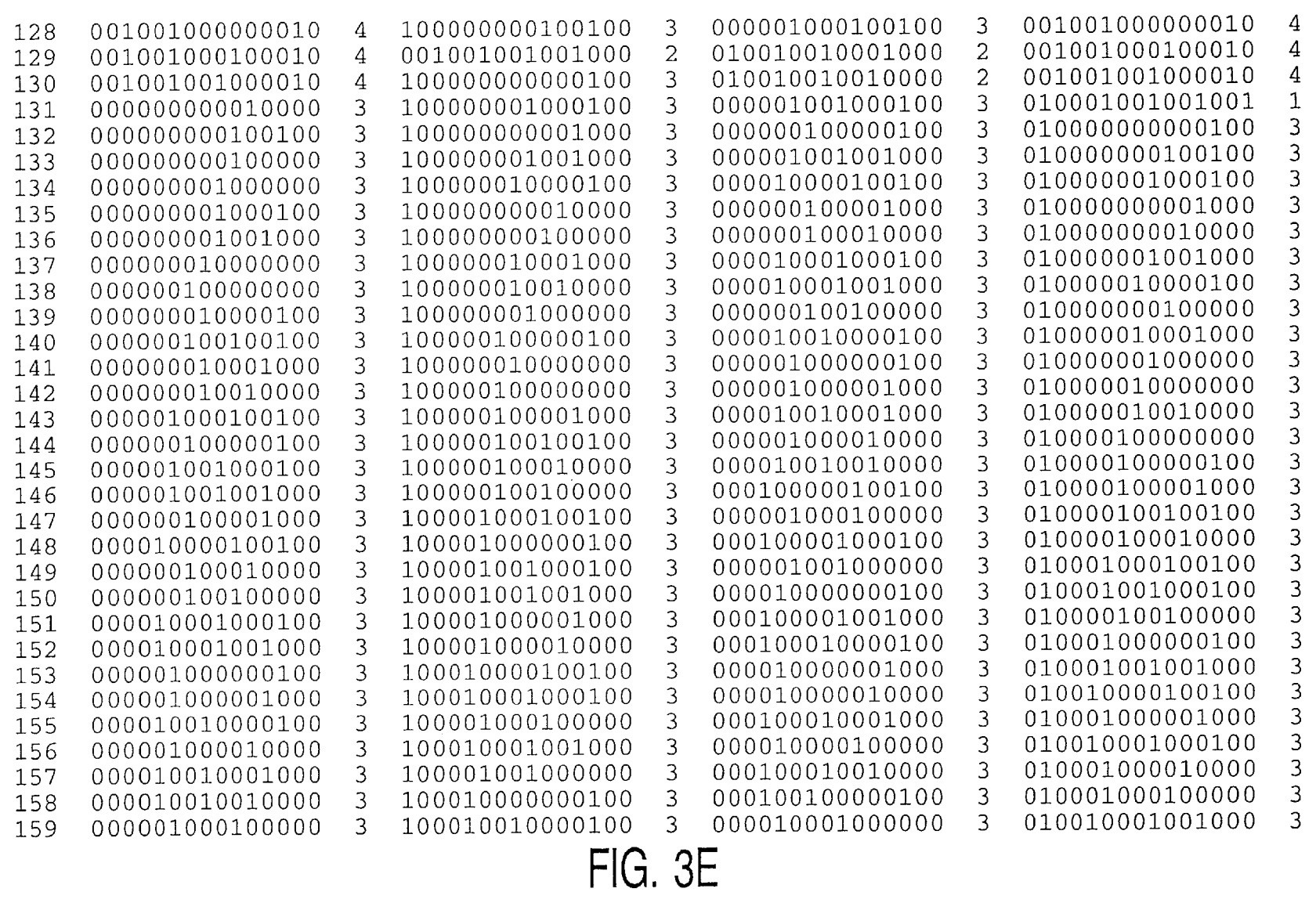
Figure 3F:
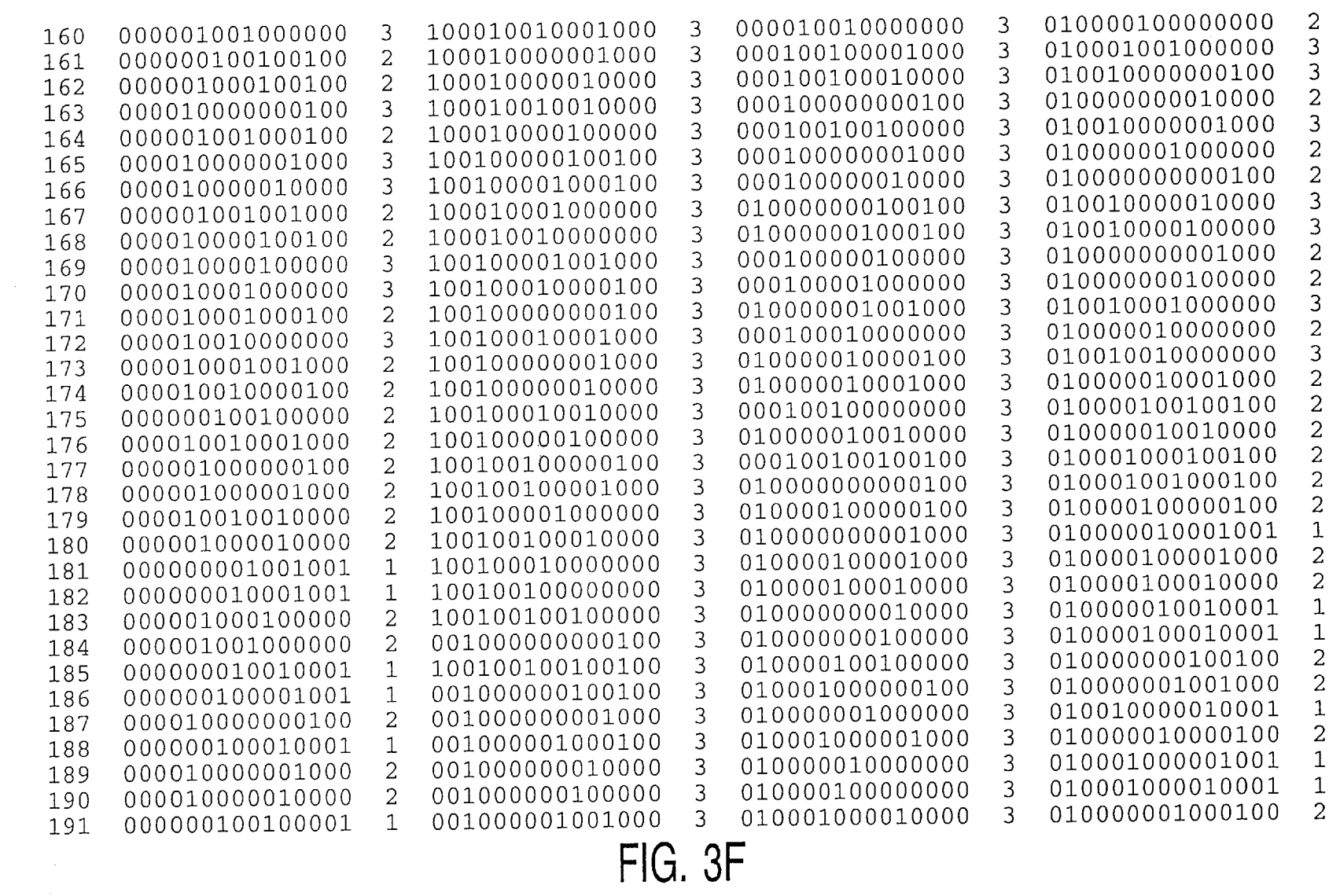
Figure 3G:
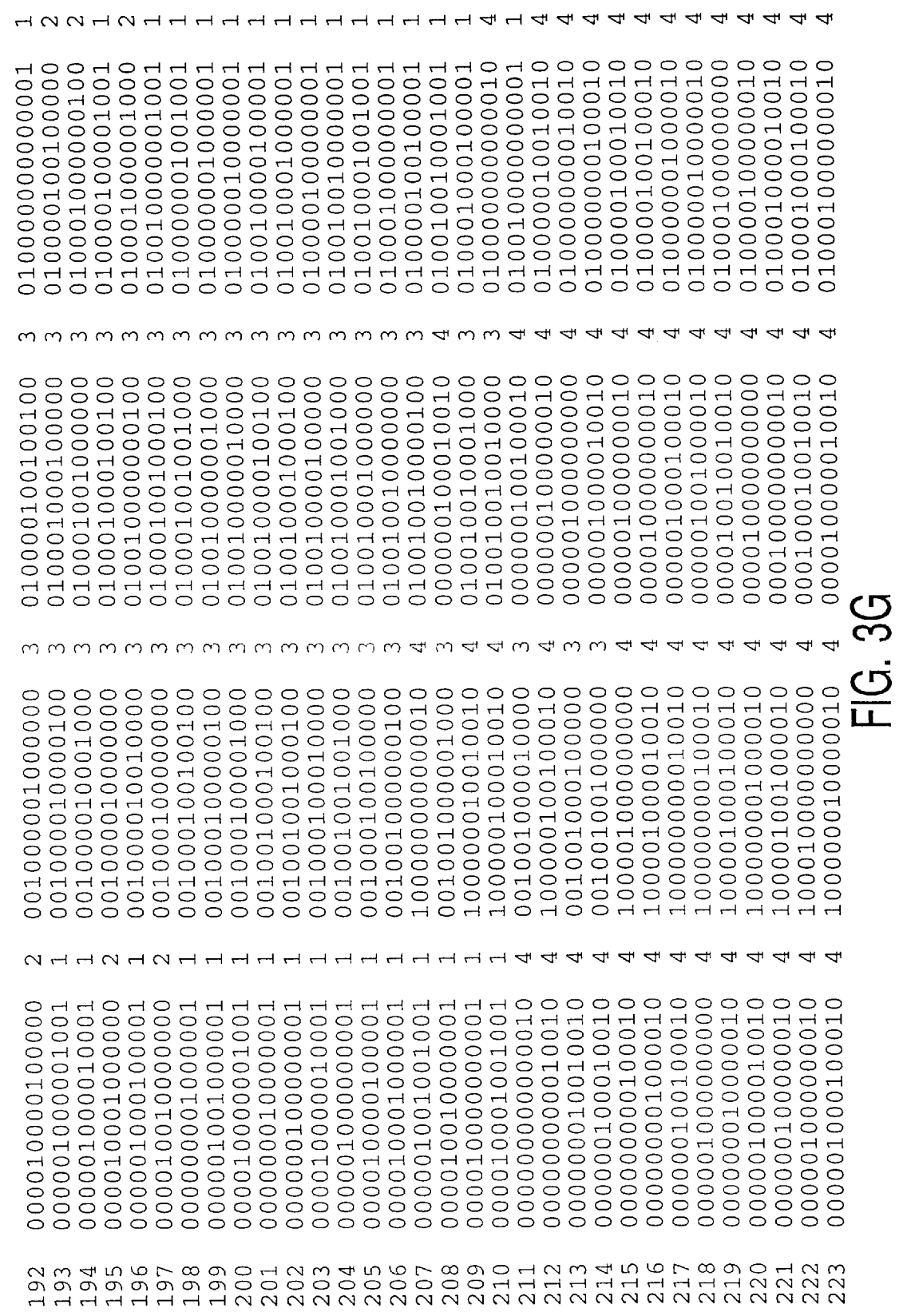
Figure 3H:
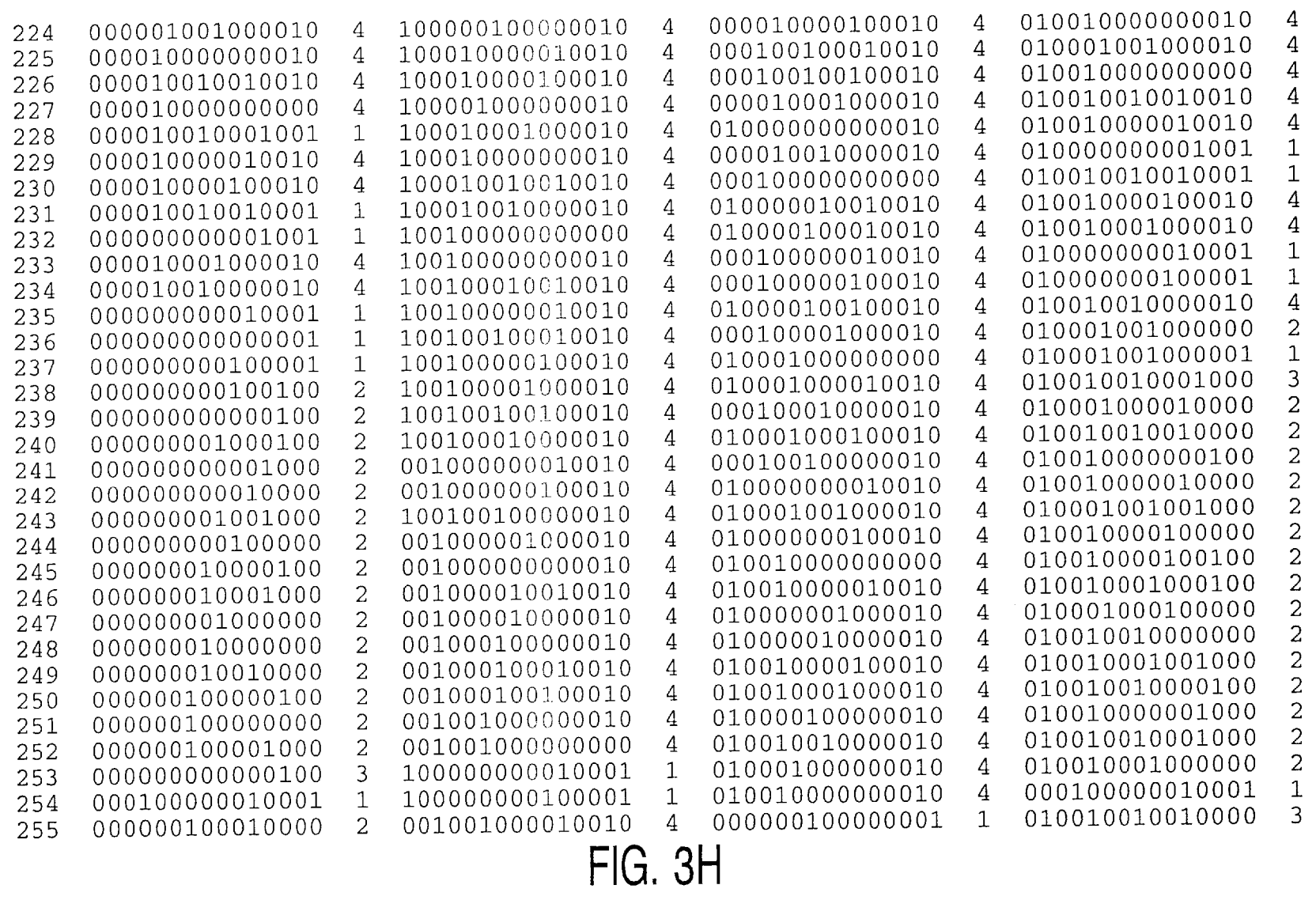

FIGS. 3A–3H show the coding states for a (2,14) parity preserving channel signal sequence;

Figure 4A:
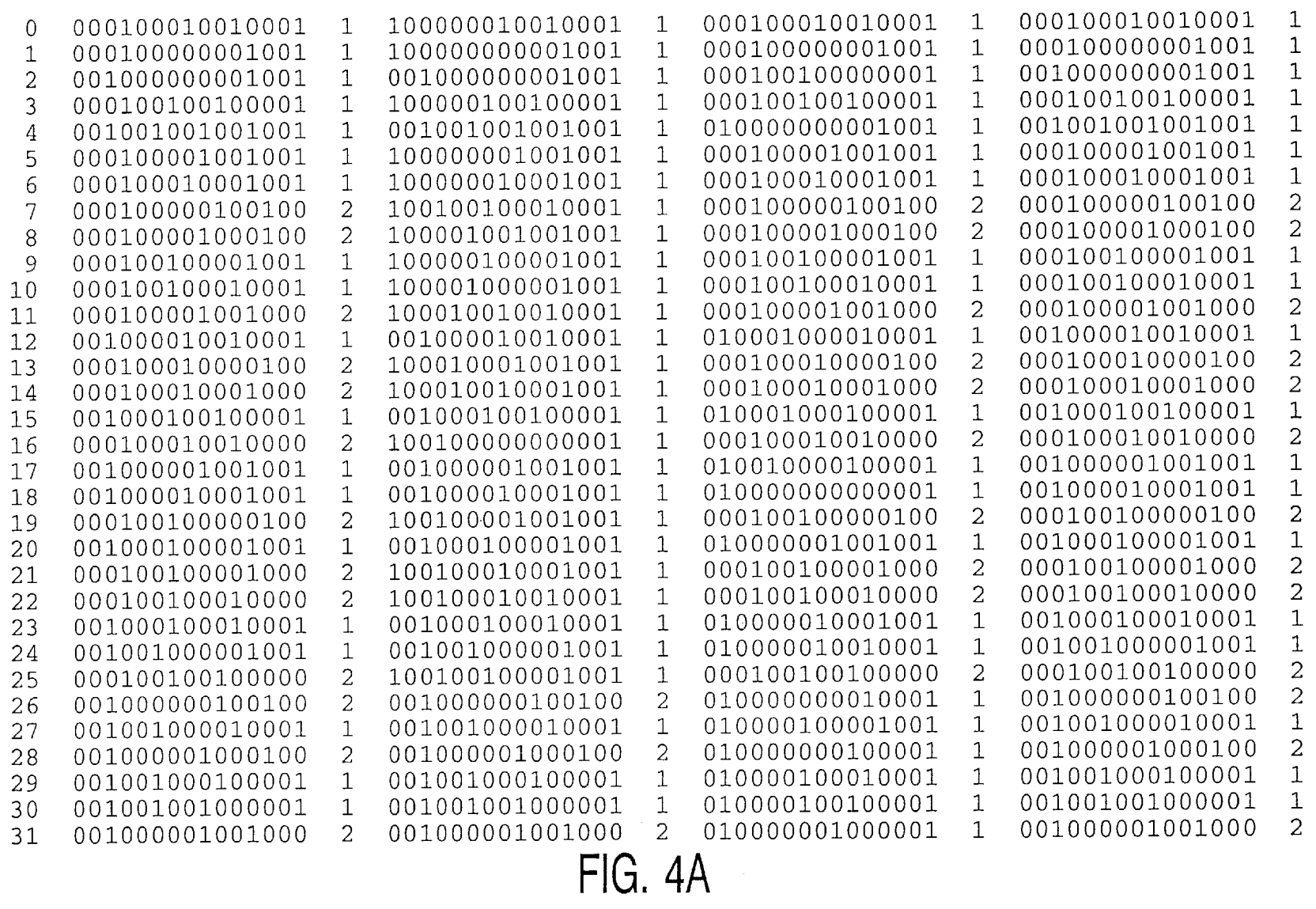
Figure 4B:
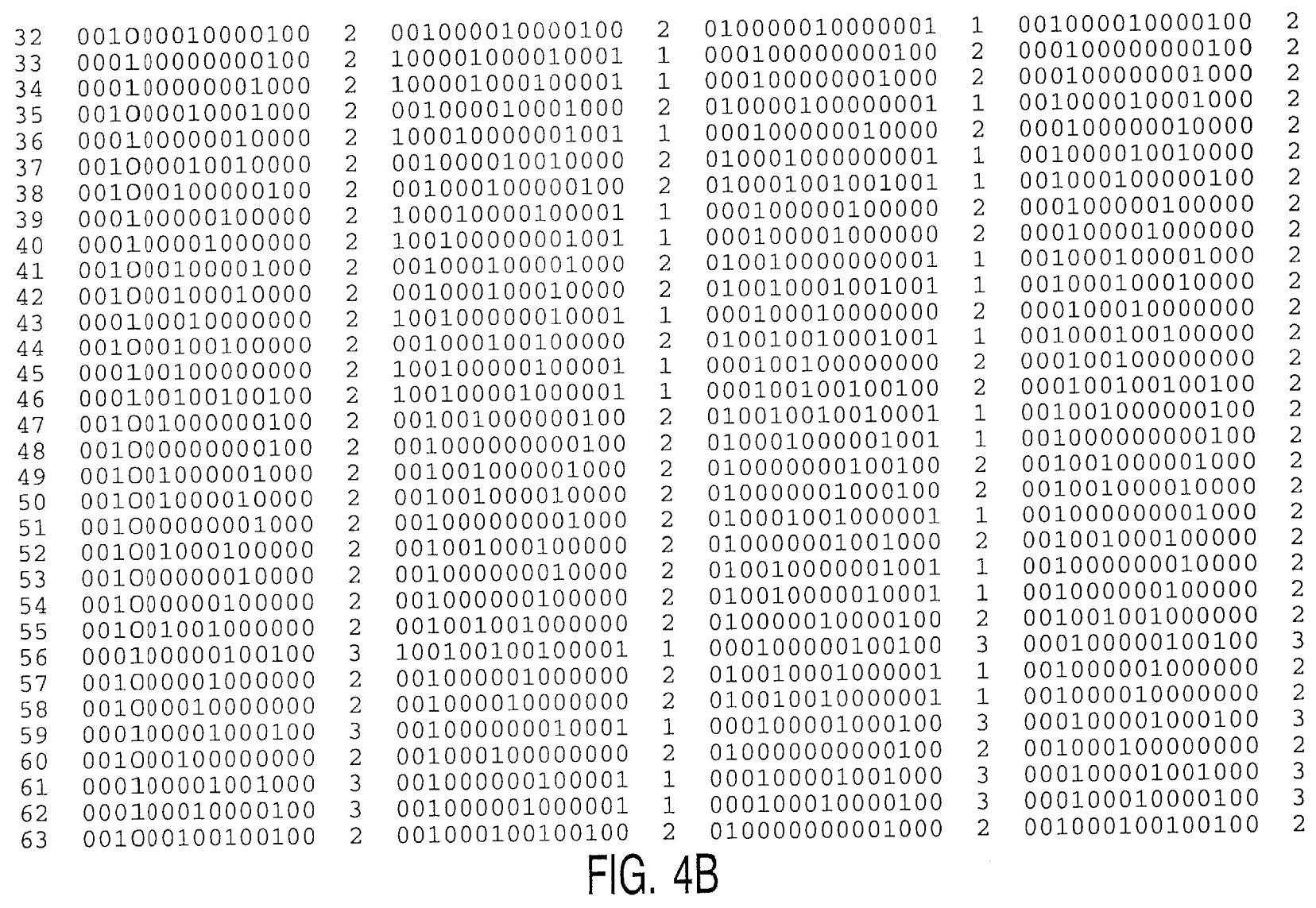
Figure 4C:
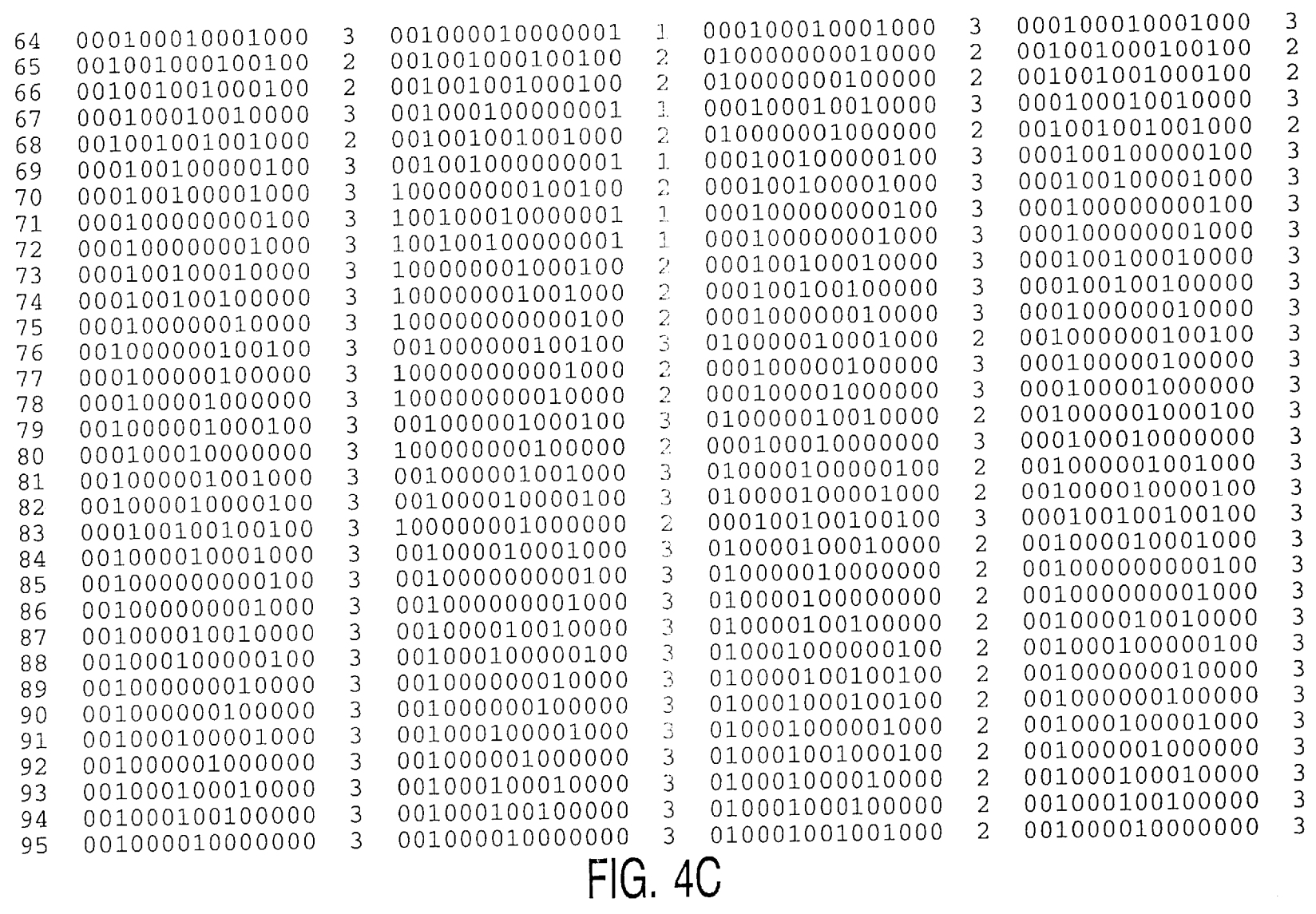
Figure 4D:
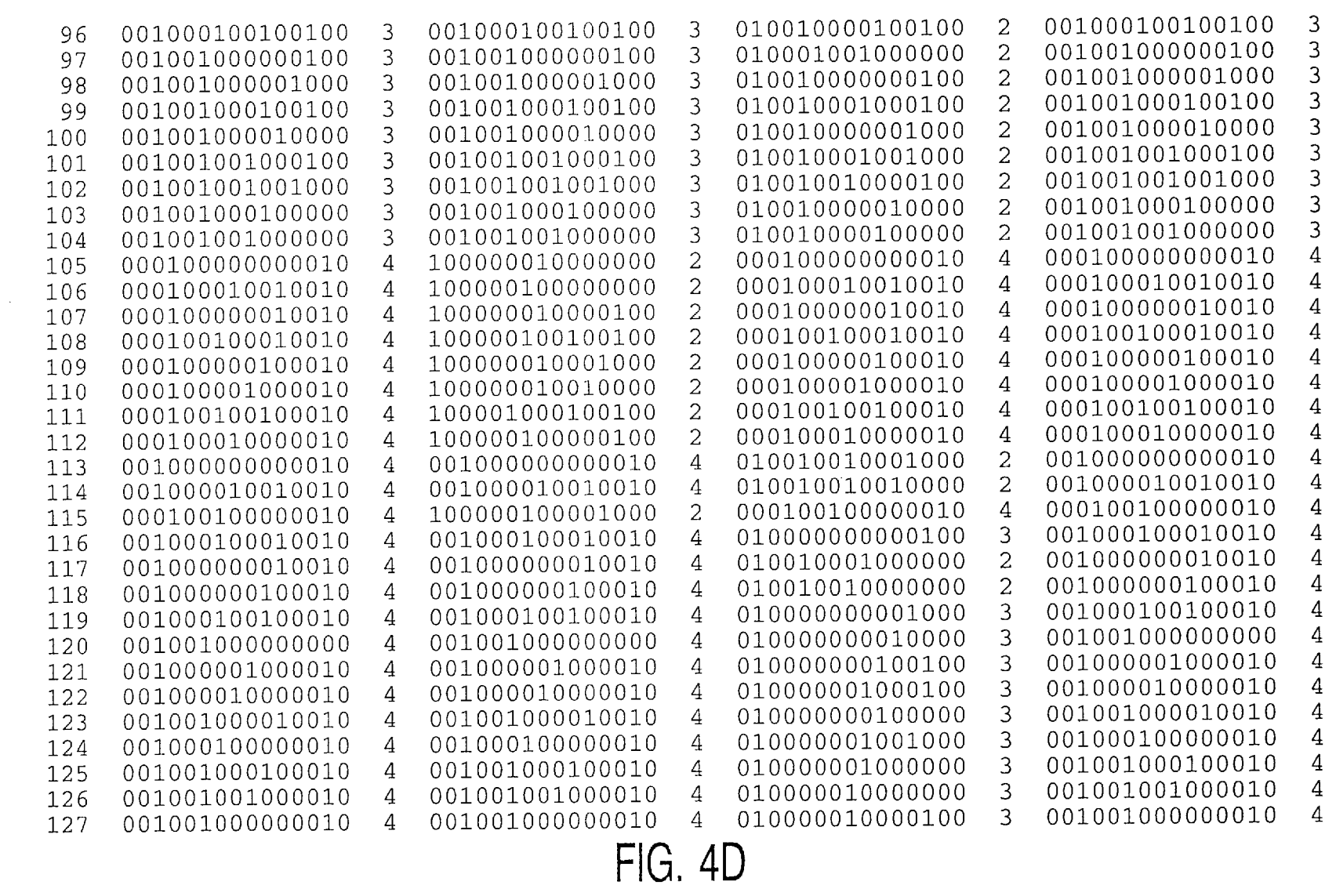
Figure 4E:
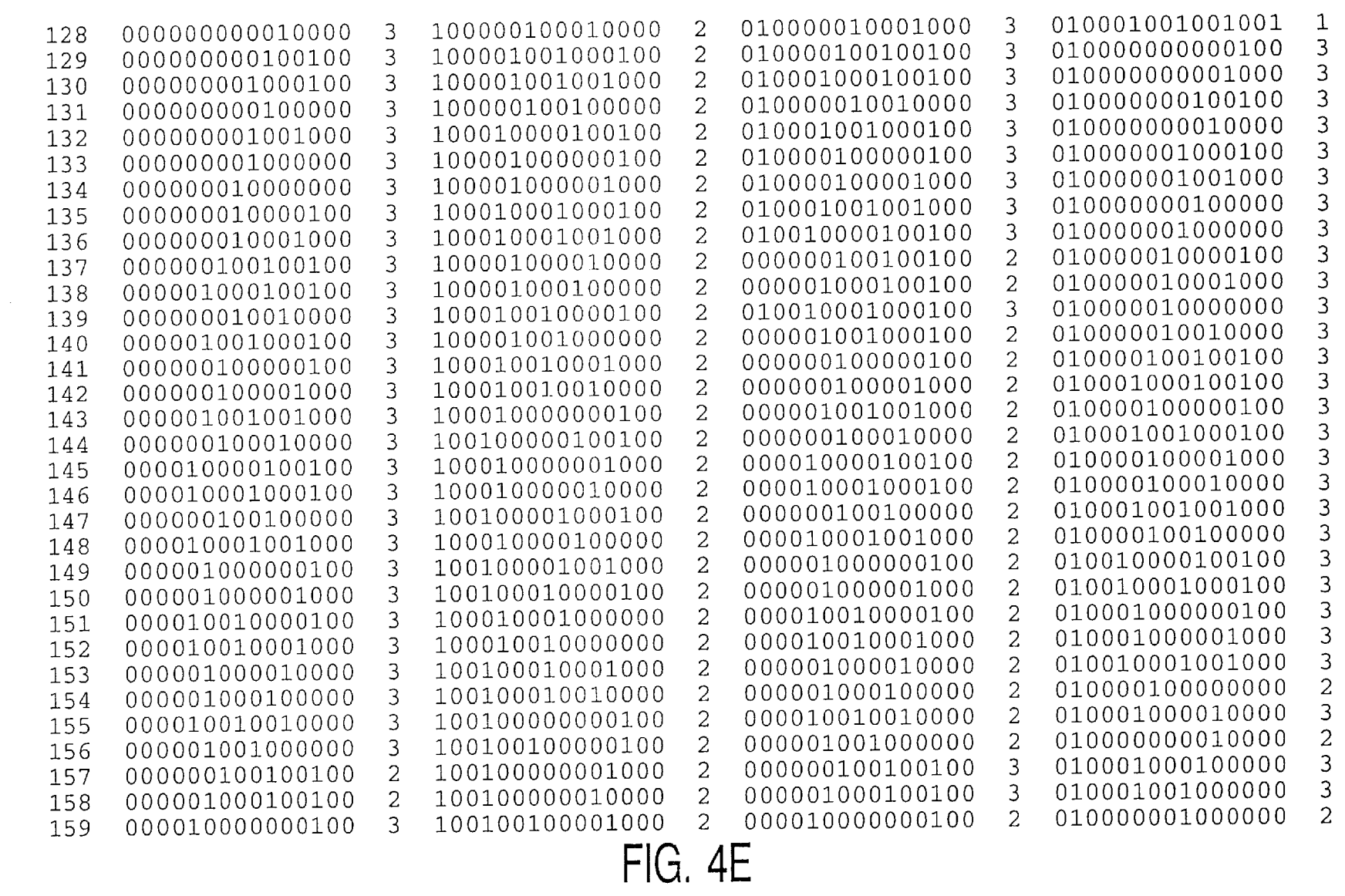
Figure 4F:
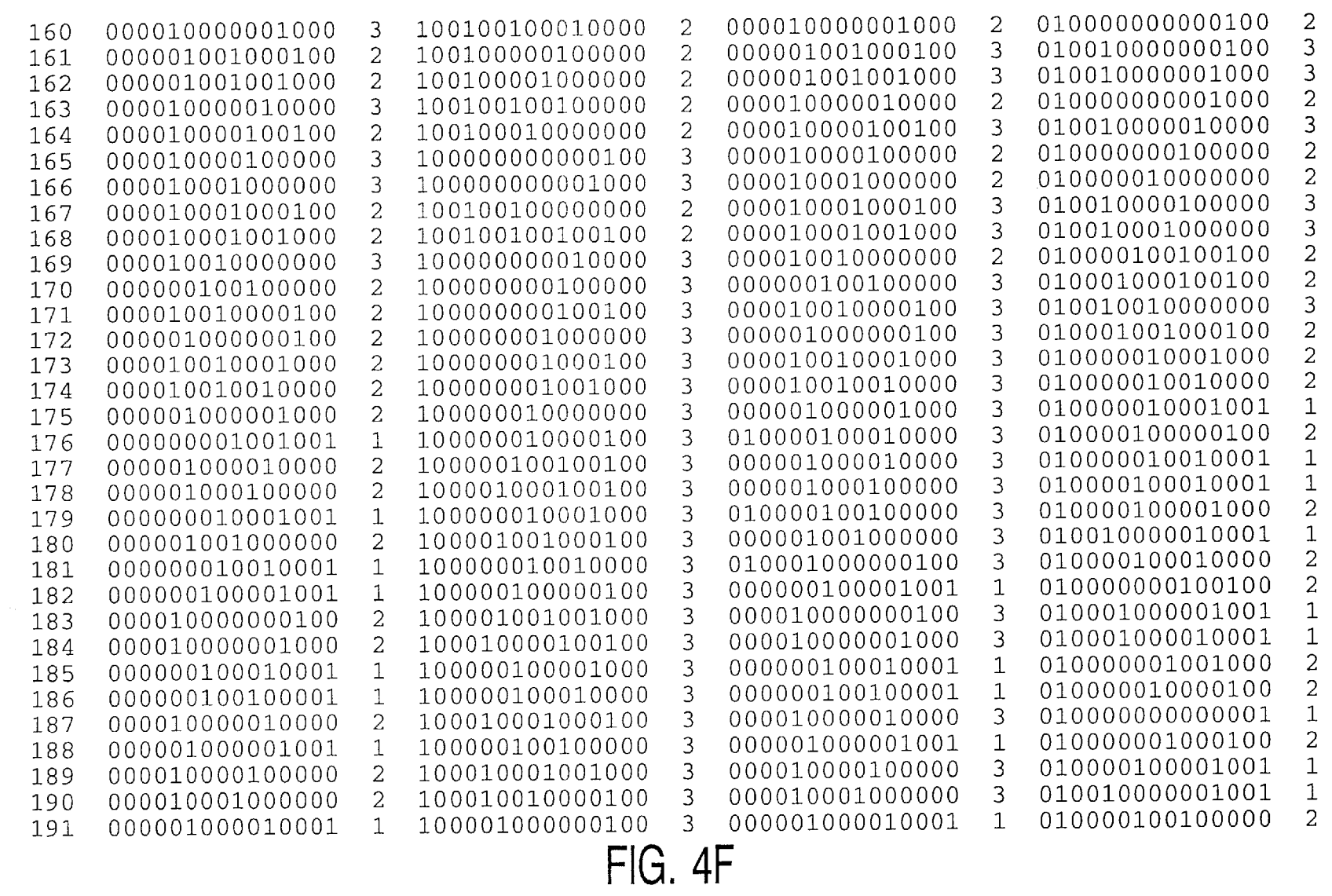
Figure 4G:
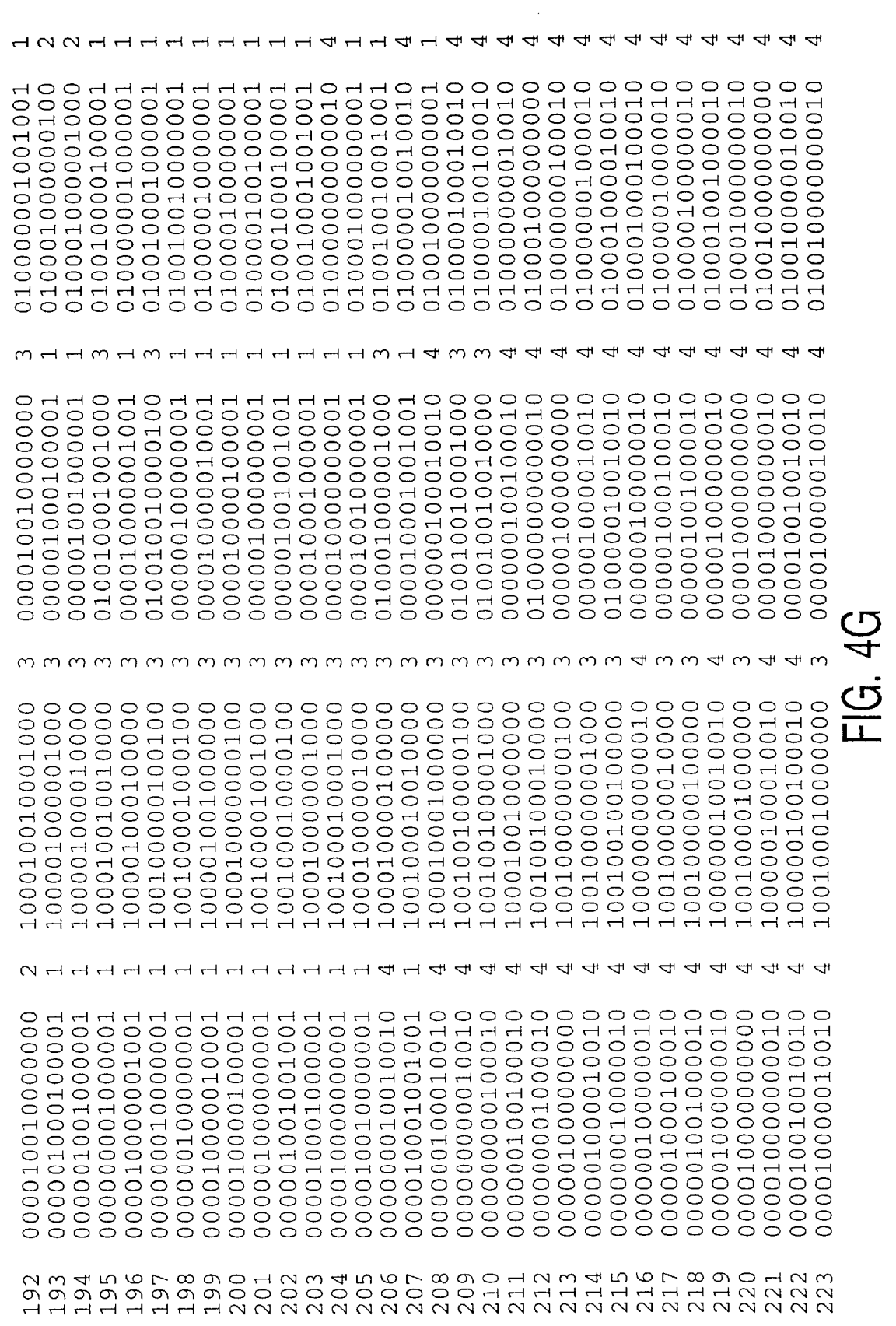
Figure 4H:
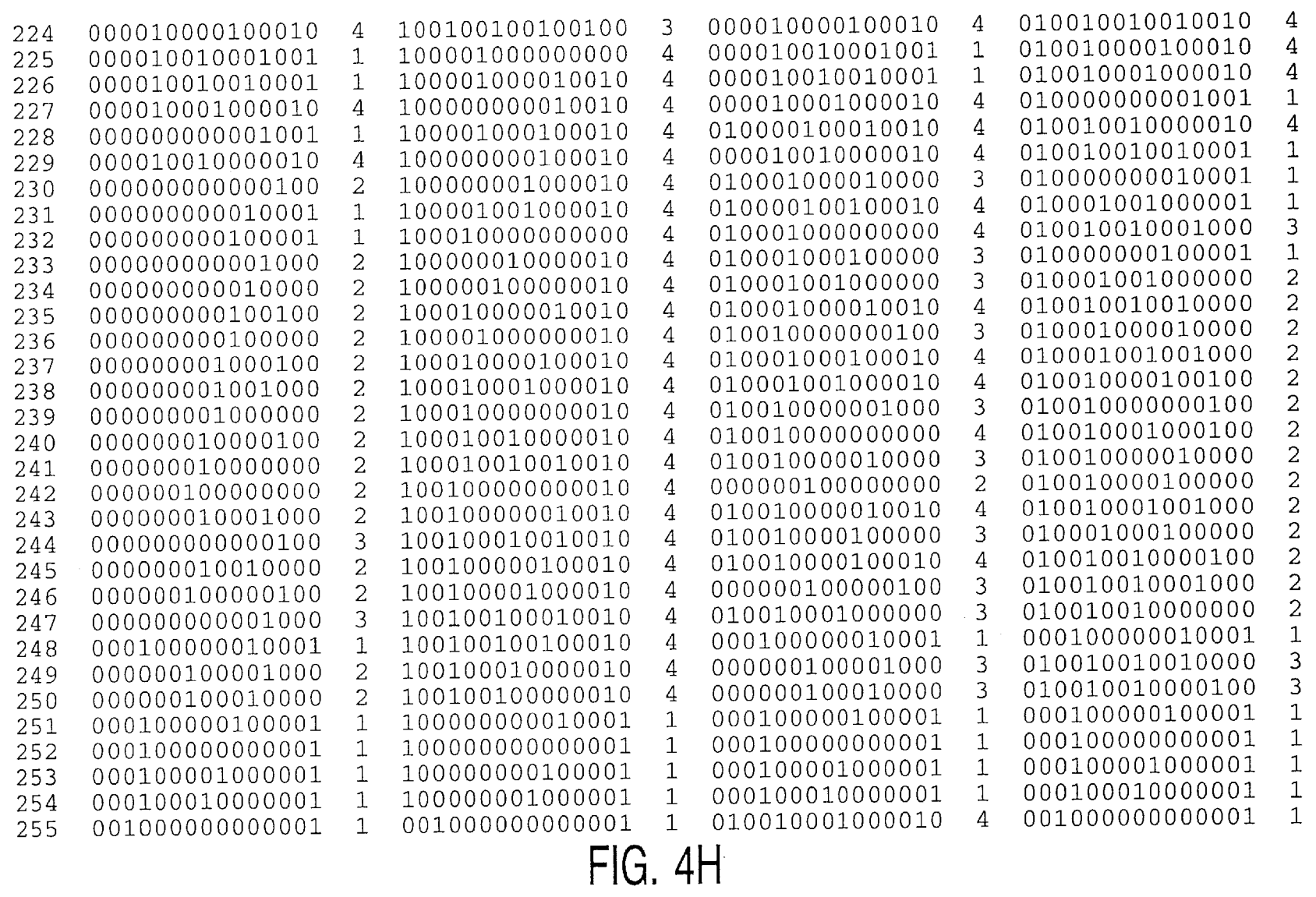

FIGS. 4A–4H show the coding states for a (2,13) parity preserving channel signal sequence; and FIGS. 5A–5H show the coding states for a (2, 12) channel signal sequence, wherein most source word-to-channel word conversions are parity preserving.

FIG. 1 shows an encoding device, which can be considered as a modification of the coding device 140, described in the above mentioned WO97/09718/A1 and applied in a recording device and a decoding and play back device described too in said document. Therefore, the contents of said document must be considered as inserted in the present specification.

Figure 1:
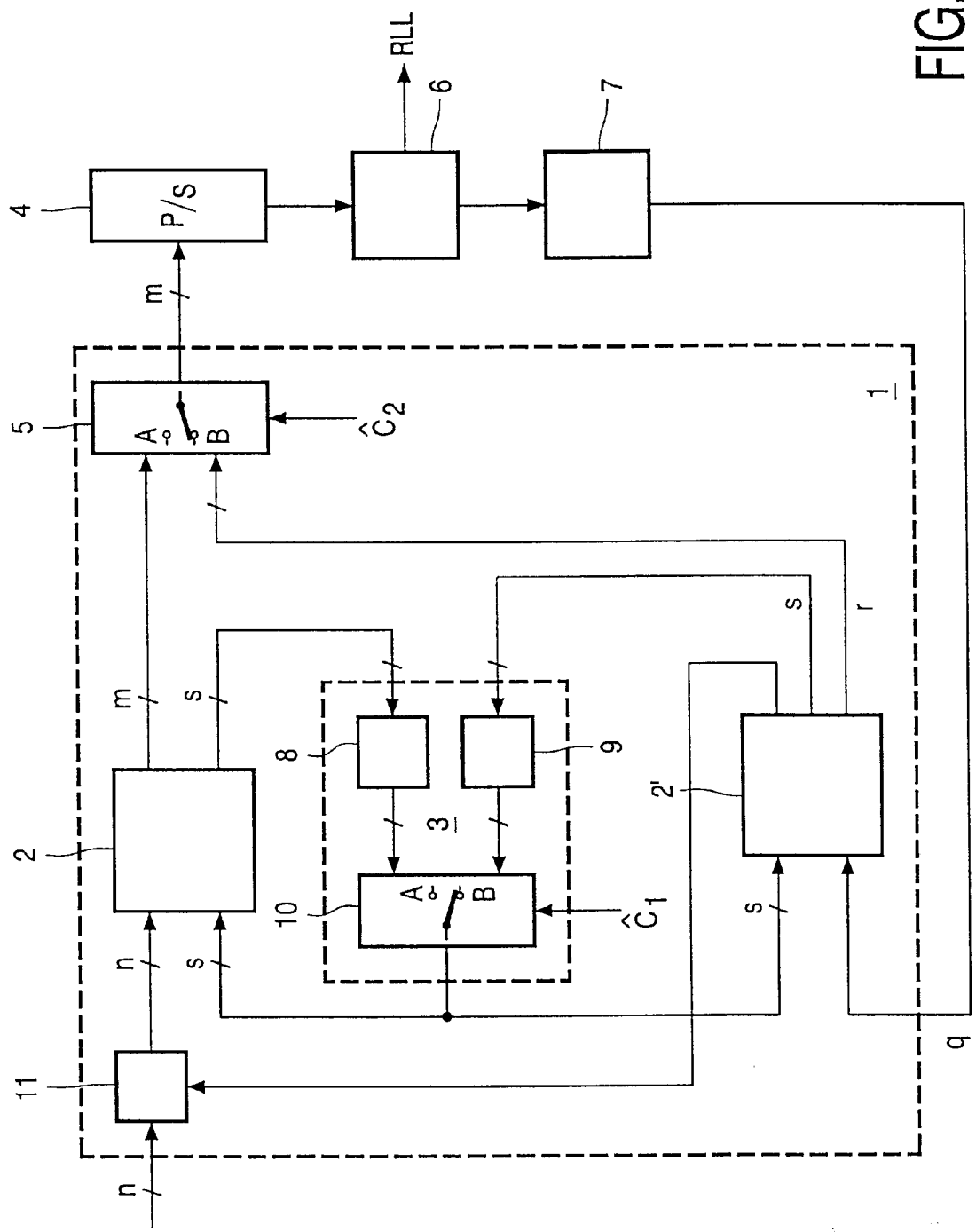
FIG. 1 shows block schematically an encoding device according to the invention.

The encoding device comprises converting means 1, arranged for converting n-bit source words into m-bit channel words, present in different coding states in a memory 2. The coding states are indicated by s bits. The input signals of the memory 2 are formed by a n-bit source word and a s-bit coding state number, indicating the current coding state where the relevant channel word can be found. The output signals of the memory 2 are formed by a m-bit channel word and a s-bit coding state number, indicating the next coding state, i.e. the state where the next channel word, corresponding with the next source word, can be found. The next state number, supplied by the memory 2 is delivered to said memory via a buffer unit 3.

The m-bit channel words are supplied to a parallel-to-serial converter (P/S) 4 via a switching unit 5 described later on. The serial bit string from the parallel-to-serial converter 4 is supplied to a 1T-precoder 6, well known in the art. The output signal of the 1T-precoder 6 is applied to a control signal generator 7, which generates the control signal for the converting means 1, so as to insert after each block of p consecutive source words q dc-control source bits. The closed loop formed, formed by the converter means 1, the parallel-to-serial converter 4, the 1T-precoder 6 and the control signal generator 7 are well known in the art, e.g. from U.S. Pat. No. 5,477,222. The output signal of the device, supplied by the 1T-precoder is a RLL (run length limited) output signal.

The converting means 1 comprise a memory 2' for converting the q dc-control source bits into r dc-control channel bits, present in different coding states in the memory 2'. In practice the memories 2 and 2' are integrated and form one memory 2, 2'. The coding states again are indicated by s bits. The input signals of the memory 2' are formed by the q dc-control source bits and a s-bit coding state number, indicating the current coding state where the relevant dc-control channel bits can be found. The output signals of the memory 2' are formed by r dc-control channel bits and a s-bit coding state number, indicating the next coding state, i.e. the state where the next m-bit channel word, corresponding with the next n-bit source word, can be found. The next state number, supplied by the memory 2' is delivered to the memory 2 again via buffer unit 3.

The buffer unit 3 comprises a first and a second delay element 8 and 9 respectively and switching means 10 for passing either the next s state number bits from the memory 2 or the next s state number bits from the memory 2'. The switching means 10, as well as the switching means 5 are controlled by the timing unit (not indicated in the figure) of the device.

The invention will further been explained for an example wherein, each time after four (p=4) consecutive 8-bit source words (n=8) are converted into 15-bit channel words (n=15), a dc-control source bit (q=1) is converted into two dc-control channel bits (r=2) and wherein the memory 2 contains for each source word 4 possible channel words, arranged in state tables, indicated by a 2-bit state number (s=2) 1, 2, 3 or 4. When in the memory 2 a source word is converted into a channel word, the state number for the next conversion is read out too and supplied via delay element 8 and the switching means 10 with a conversion clock delay to the input bus of the memory 2, so that the channel word for the next conversion is determined. The switching means 10 are in the position A in FIG. 1. The channel word from the memory 2 is converted in a serial bitstring via the switching means 5 in the position A. After this process is repeated four times and, therefore, 4 consecutive source words are converted, from the bitstring of the obtained consecutive channel words and via the 1T-precoder 6 and the control signal generator 7, a dc-control source bit "0" or "1" is generated and supplied to the memory 2'. As also the dc-control channel bits in the memory are dependent of the state number, the state number read out together with the last channel words indicates the state of the dc-control bit conversion. Therefore, the dc-control channel bits from memory 2 are supplied via delay element 8 and switching means 10 in the position B to memory 2' too. Based on the dc-control source bit and the respective state number the dc-control channel bits are read out, together with the state number of the next source word conversion. The latter state number is supplied again to memory 2 via delay element 9, introducing a conversion clock delay, and the switching means 10 in the position B. The dc-control channel bits are supplied to the parallel-to-serial converter 4 via the switching means 5 in the position B. Then, again 4 consecutive source words are converted into 4 corresponding channel words, whereafter again a dc-control source word is converted into a dc-control channel word. The result is that constantly the source words are aligned with the corresponding channel bits, so that, when during recording of the channel words on a carrier or during reproducing from said carrier an error occurs, this error is restricted to only the source word, obtained after conversion of the channel word into said source during reproduction, and is not propagated to other source words reproduced.

Figure 2:
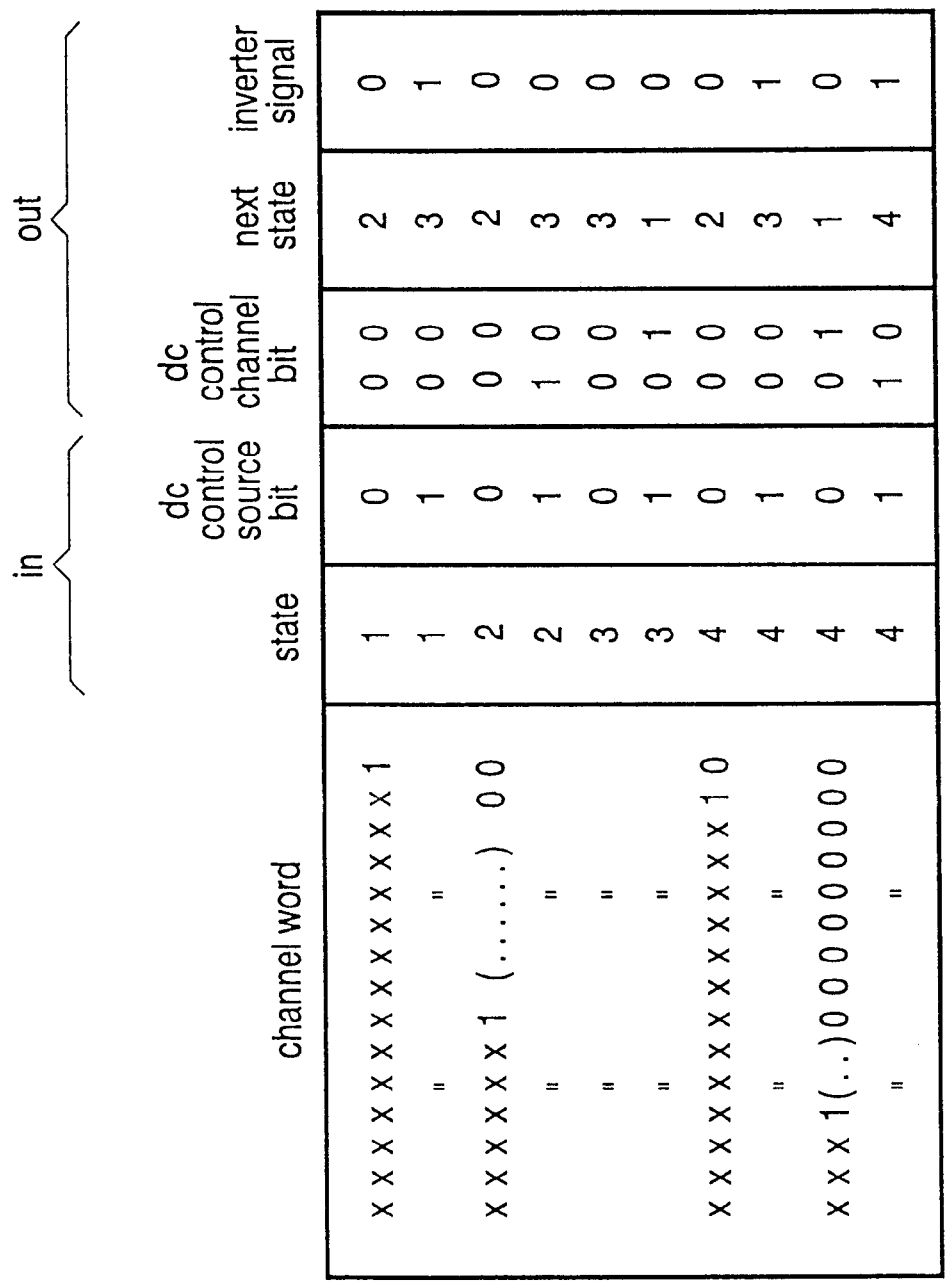
FIG. 2 shows a dc-control source bit-to-dc-control channel bit conversion table.

An example of a dc-control bit conversion as registered in memory 2' is indicated in FIG. 2. When a channel words ends with "1", the next state is state 1. Although depending on this state and the dc-control source bit "0" or "1" the dc-control channel bits would be determined, the (d,k) sequence constraint with d=2 requires at least two zero's after an one, so that in both cases the dc-control channel bits will be "00". Depending on the dc-control source bit the next state (2 or 3 in FIG. 2) is read out. Because in both cases there is no parity difference in the dc-control channel bits, such a parity difference must be made on another way. To make a parity difference between the situations where the dc-control source bits are "0" or "1", according to the invention inverting means 11 are provided to convert an uneven number of source bits, preferably only one bit of the next source word. This bit-inverting control signal for the inverting means 11 is supplied by the memory 2' in response to a dc-control source bit "1" in state 1. When a channel word ends with two to eight zero's, the dc-control channel bits can be found in states 2 or 3. In each of these states the dc-control channel bits have different parity dependent on the dc-control source bit. Therefore no source bits are inverted. When a channel word ends with "10", the dc-control channel bits can be found in state 4. Although not absolute necessary in view of the d=2 constraint, in this case, independent of the dc-control source bit the dc-control channel bits are "00", while the next conversion must be found in states 2 and 3 respectively. Again, the difference between the situations where the dc-control source bit is "0" and "1" can be made by generating, in case the latter dc-control source bit is "1", a bit inverting control signal to invert a bit of the next source word. When a channel word ends with nine, ten or eleven zero's, the dc-control channel bits can also be found in state 4. In this case, independent of the dc-control source bit the dc-control channel bits are "01" and "10" respectively, while the next conversion now must be found in states 1 and 4 respectively. As the latter dc-control channel bits have the same parity, the difference between the situations where the dc-control source bit is "0" and "1" can again be made by generating, in case the latter dc-control source bit is "1", a bit inverting control signal to invert a bit of the next source word. By the parity preserving property of the (d,k) code, a sign inversion of the outgoing bitstream during reproduction will occur. This, however, can be corrected easily because the combination of the dc-control channel bits and the last state number is unique.

The alignment of source words and channel words can be applied to several (d,k) codes. In the above bit sequence d=2. From WO97/09718/A1 a (2,14) bitsequence is known, however, without any parity preserving guarantee. By applying the invention it is possible to guarantee parity preserving in combination with alignment of source words and channel words. An example of such a code is given in FIGS. 3A–3H, which figure shows a (2,14) parity preserving code. As it is advantageous to restrict the k constraint as much as possible and to realize state tables, wherein multiple used channel words refer to a same source word as much as possible, a (2,13) parity preserving code has been found. This code is indicated in FIGS. 4A–4H. When identical channel words refer to different source words and an error in the state number indication occurs, during reproduction the wrong source word is obtained and possibly the wrong state number for the next channel word-tot source word conversion. This results in another type of error propagation. In the above (2,13) code these errors are strongly reduced. Even a (2,12) code was found, wherein most of the 1024 source-to-channel conversions are parity preserving. Such a code is indicated in FIGS. 5A–5H; in that code only 10 of the $4 \times 2^8$ conversions are not parity preserving.

What is claimed is:

1. A device for encoding a stream of databits of a binary source signal into a stream of databits of a binary channel signal, wherein the bitstream of the source signal is divided into n-bit source words, which device comprises converting means adapted to convert a block of p consecutive n-bit source words into a corresponding block of p consecutive m-bit channel words, where p, n, m are integers and $m > n \geq 1$, the converting means comprising memory means which contain for each n-bit source word a number of m-bit channel words, arranged in coding states, and a corresponding state number, indicating the coding state for a next m-bit channel word, in which the conversion for at least most of the n-bit source words is parity preserving and/or parity inverting, and that after each block of source words q dc-control sourcebits are added, which dc-control sourcebits are converted into r dc-control channelbits, independent of the conversion of a following source word, where q and r are integers.

2. A device for encoding a stream of databits of a binary source signal into a stream of databits of a binary channel signal, wherein the bitstream of the source signal is divided into n-bit source words, which device comprises converting means adapted to convert a block of p consecutive n-bit source words into a corresponding block of p consecutive m-bit channel words, where p, n, m are integers and $m > n \geq 1$, the converting means comprising memory means which contain for each n-bit source word a number of m-bit channel words, arranged in coding states, and a corresponding state number, indicating the coding state for a next m-bit channel word, in which the conversion for at least most of the n-bit source words is parity preserving and/or parity inverting, and that after each block of source words q dc-control sourcebits are added, which dc-control sourcebits together with only a following n-bit source word is converted into a (r+m)-bit channelword, where q and r are integers.

3. The device according to claim 1 or 2, in which the channel output signal sequence supplied by the converting means is fed to a precoder to determine a RLL (run length limited) output signal, which signal is supplied to a control signal generator to derive the dc-control bits.

4. The device according to claim 1 or 2, in which the memory means further contain for each q dc-control source bits and for each state number, r dc-control channel bits and a corresponding state number, indicating the memory location for a next m-bit channel word.

5. The device according to claim 1 or 2, in which n=8, m=15, q=1 and r=2, while p is chosen dependent on the desired dc-suppression.

6. The device according to claim 1 or 2, in which the device comprises inverting means, which, depending on a last preceding channelword, the state number read out together with said last preceding channelword and on the dc-control channel bits, can provide for inversion of an odd number of bits of a following source word.

7. The device according to claim 1 or 2, in which multiple used channel words in the coding states refer substantially to a same source word.

8. Memory means with coding states for application in the device according to claim 1 or 2, in which 15-bit channel words form a parity preserving (2,14) sequence.

9. Memory means with coding states for application in the device according to claim 1 or 2, in which 15-bit channel words form a parity preserving (2,13) sequence.

10. Memory means with coding states for application in the device according to claim 1 or 2, in which 15-bit channel words form a (2,12) sequence, while most of the 1024 source-to-channel conversions are parity preserving.

11. A device for recording information, which device comprises an encoding device according to claim 1 or 2 for converting a series of channel words representing the information into a modulated signal and means for recording an information pattern corresponding to said modulated signal on a record carrier.

12. A record carrier on which a modulated signal is recorded, said signal comprising a series of channel words, obtained by encoding source words according to claim 1 or 2.

13. A device for decoding channel words into source words comprising converting means with memory means containing the same coding states as the memory means in claim 1 or 2, which coding states are read out inversely.

14. A device for playing back comprising: a reading arrangement for reading a record carrier according to claim 12; and a decoding device for decoding channel words into source words comprising converting means with memory means containing the same coding states as the memory means, which coding states are read out inversely.

15. A device for playing back comprising: a reading arrangement for reading a record carrier on which a modulated signal is recorded, said signal comprising a series of channel words, obtained by encoding source words; and a decoding device according to claim 13.

16. The device according to claim 3, in which:

the memory means further contain for each q dc-control source bits and for each state number, r dc-control channel bits and a corresponding state number, indicating the memory location for a next m-bit channel word;

n=8, m=15, q=1 and r=2, while p is chosen dependent on the desired dc-suppression;

the device comprises inverting means, which, depending on a last preceding channelword, the state number read out together with said last preceding channelword and on the dc-control channel bits, can provide for inversion of an odd number of bits of a following source word; and multiple used channel words in the coding states refer substantially to a same source word.

17. The memory means according to claim 10, in which:

the channel output signal sequence supplied by the converting means is fed to a precoder to determine a RLL (run length limited) output signal, which signal is supplied to a control signal generator to derive the dc-control bits;

the memory means further contain for each q dc-control source bits and for each state number, r dc-control channel bits and a corresponding state number, indicating the memory location for a next m-bit channel word;

n=8, m=15, q=1 and r=2, while p is chosen dependent on the desired dc-suppression;

the device comprises inverting means, which, depending on a last preceding channelword, the state number read out together with said last preceding channelword and on the dc-control channel bits, can provide for inversion of an odd number of bits of a following source word;

multiple used channel words in the coding states refer substantially to a same source word;

15-bit channel form a parity preserving (2,14) sequence; and 15-bit channel form a parity preserving (2,13) sequence.

18. The device for recording information according to claim 11, in which:

the channel output signal sequence supplied by the converting means is fed to a precoder to determine a RLL (run length limited) output signal, which signal is supplied to a control signal generator to derive the dc-control bits;

the memory means further contain for each q dc-control source bits and for each state number, r dc-control channel bits and a corresponding state number, indicating the memory location for a next m-bit channel word; n=8, m=15, q=1 and r=2, while p is chosen dependent on the desired dc-suppression;

the device comprises inverting means, which, depending on a last preceding channelword, the state number read out together with said last preceding channelword and on the dc-control channel bits, can provide for inversion of an odd number of bits of a following source word; and multiple used channel words in the coding states refer substantially to a same source word.

19. The record carrier according to claim 12, in which:

the channel output signal sequence supplied by the converting means is fed to a precoder to determine a RLL (run length limited) output signal, which signal is supplied to a control signal generator to derive the dc-control bits;

the memory means further contain for each q dc-control source bits and for each state number, r dc-control channel bits and a corresponding state number, indicating the memory location for a next m-bit channel word;

n=8, m=15, q=1 and r=2, while p is chosen dependent on the desired dc-suppression;

the device comprises inverting means, which, depending on a last preceding channelword, the state number read out together with said last preceding channelword and on the dc-control channel bits, can provide for inversion of an odd number of bits of a following source word; and multiple used channel words in the coding states refer substantially to a same source word.

20. A device for decoding channel words into source words comprising converting means with memory means containing the same coding states as the memory means in claim 17 which coding states are read out inversely.

21. A device for playing back comprising a reading arrangement for reading a record carrier according to claim 19 and a decoding device.

22. A device for playing back comprising a reading arrangement for reading a record carrier and a decoding device according to claim 20.

* * * * *